United States Patent [19]

Tanaka et al.

[11] Patent Number: 5,462,919
[45] Date of Patent: Oct. 31, 1995

[54] METHOD FOR MANUFACTURING SUPERCONDUCTING THIN FILM FORMED OF OXIDE SUPERCONDUCTOR HAVING NON SUPERCONDUCTING REGION AND DEVICE UTILIZING THE SUPERCONDUCTING THIN FILM

[75] Inventors: So Tanaka; Michitomo Iiyama, both of Osaka, Japan

[73] Assignee: Sumitomo Electric Industries,Ltd., Osaka, Japan

[21] Appl. No.: 198,362

[22] Filed: Feb. 18, 1994

Related U.S. Application Data

[62] Division of Ser. No. 936,668, Aug. 28, 1992, abandoned.

[30] Foreign Application Priority Data

Aug. 28, 1991 [JP] Japan ................... 3-242801
Aug. 28, 1991 [JP] Japan ................... 3-242802

[51] Int. Cl.[6] ................ B05D 5/00; B44C 1/22
[52] U.S. Cl. .......... 505/410; 505/329; 505/820; 437/910; 216/3; 216/101; 216/100
[58] Field of Search ................. 156/628, 647, 156/652, 656, 659.1, 667; 204/192.24; 427/62, 63; 505/100, 728, 816, 817, 820, 922, 329, 410, 413, 482, 500, 193; 437/910; 216/3, 101, 100

[56] References Cited

U.S. PATENT DOCUMENTS

| | | | |
|---|---|---|---|
| 4,439,269 | 3/1984 | Cakauskas | 156/643 |
| 4,931,424 | 6/1990 | Henty | 505/1 |
| 4,971,948 | 11/1990 | Dam et al. | 505/410 X |
| 4,997,809 | 3/1991 | Gupta | 505/410 |
| 5,215,960 | 6/1993 | Tanaka et al. | 505/329 |

FOREIGN PATENT DOCUMENTS

| | | |
|---|---|---|
| 0276746 | 8/1988 | European Pat. Off. . |
| 0280308 | 8/1988 | European Pat. Off. . |
| 0324044 | 7/1989 | European Pat. Off. . |
| 0354804 | 2/1990 | European Pat. Off. . |
| 0484253 | 5/1992 | European Pat. Off. . |
| 0488837 | 6/1992 | European Pat. Off. . |
| 3924022 | 1/1991 | Germany . |
| 63-269585 | 11/1988 | Japan . |
| 1-170080 | 7/1989 | Japan . |
| 0137380 | 5/1990 | Japan ..................... 437/910 |

OTHER PUBLICATIONS

Patent Abstracts of Japan, vol. 13, No. 186, (E–752) (3534), Hitachi, *Formation of Josephson Element*, May 2, 1989.
Patent Abstracts of Japan, vol. 13, No. 46, (E–711) (3394), Toshiba, *Superconducting Transistor*, Feb. 2, 1989.
*Allied Physics Letters*, vol. 57, No. 11, R. C. Dye, et al., p. 1149, Sep. 10, 1990.
Wu, et al., "High Critical Currents in Epitaxial YBaCuO Thin Films On Silicon With Buffer Layers", *Appl. Phys. Lett.*, 54:8, 20 Feb. 1989, pp. 754–756.
Berkowski, et al., "Ca Nd $AlO_4$ Perovskite Substrate For Microwave And Far–Infared . . . ", *Appl. Phys. Lett.*, 56:6, 6 Aug., 1990, pp. 632–634.

*Primary Examiner*—William Powell
*Attorney, Agent, or Firm*—Foley & Lardner

[57] ABSTRACT

For manufacturing a superconducting thin film having at least one non-superconducting region at and near its surface portion, an oxide superconductor thin film is formed on a surface of the substrate. The oxide superconductor thin film is heated in high vacuum environment so that oxygen of the oxide superconductor crystals escapes from the surface of the oxide superconductor thin film and a surface portion of the oxide superconductor thin film having a substantial thickness changes into non-superconducting layer of a compound oxide which is composed of the same constituent elements as those of the oxide superconductor but includes the oxygen amount less than that of the oxide superconductor and a thin superconducting channel is formed under the non-superconducting layer. A portion of the non-superconducting layer, which will become the non-superconducting region is selectively masked, and heated in an oxidation atmosphere so that oxygen penetrates into the non-superconductor layer from exposed surface and the compound oxide of the exposed portion of the non-superconductor layer changes into the oxide superconductor which is electrically connected to the superconducting channel.

22 Claims, 4 Drawing Sheets

1

METHOD FOR MANUFACTURING SUPERCONDUCTING THIN FILM FORMED OF OXIDE SUPERCONDUCTOR HAVING NON SUPERCONDUCTING REGION AND DEVICE UTILIZING THE SUPERCONDUCTING THIN FILM

This application is a division of application Ser. No. 07/936,668, filed Aug. 28, 1992, now abandoned.

BACKGROUND OF THE INVENTION

1. Field of the invention

The present invention relates to a method for manufacturing a superconducting thin film, to a method for manufacturing a superconducting device and a superconducting thin film, and more specifically to a method for manufacturing a superconducting thin film having a non-superconducting region, such as an insulating layer, in it, a method for manufacturing a superconducting device which utilizes the superconducting thin film and the superconducting thin film manufactured thereby.

2. Description of related art

In order to produce superconducting devices which utilize an oxide superconductor, it is necessary to form an oxide superconductor thin film. For example, in order to prepare a tunnel type Josephson device which consists of SIS (superconductor-insulator-superconductor) junction, it is necessary to form a stacked structure which includes a first oxide superconductor thin film, an insulator thin film stacked on the first oxide superconductor thin film and a second oxide superconductor thin film stacked on the insulator film. Thickness of the insulator thin film of this SIS junction is determined by coherence length of the superconductor. Since an oxide superconductor has extremely short coherence length, the thickness of the insulator thin film of an SIS junction which utilizes an oxide superconductor should be less than few nanometers.

In the prior art, there has been proposed a three-terminal superconducting device having a channel of a superconductor formed between a source electrode and a drain electrode, so that a current flowing through the superconducting channel is controlled by a voltage applied to a gate electrode formed above the superconducting channel.

In order to control the current flowing through the superconducting channel by the voltage applied to the gate electrode, the superconducting channel of the above three-terminal superconducting device, so called super-FET, should be formed of an extremely thin superconductor film. Thickness of the extremely thin superconductor thin film is favorably about 5 nanometers, when the superconducting channel is formed of an oxide superconductor thin film. A gate insulator is often inserted between the superconducting channel and the gate insulator.

Both of the above mentioned tunnel type Josephson device and super-FET have a portion in which a superconducting layer and a insulator layer are stacked to each other. When the insulator layer is deposited on a portion of the superconductor layer, a photoresist is mainly used in order to mask portions on which the insulator layer should not be deposited. The photoresist is removed ultimately, however, fragments of the photoresist may remain so that the surface of the superconducting layer is contaminated. In case of oxide superconductor thin film, photoresist remover may react on the oxide superconductor thin film so that the surface of the oxide superconductor thin film loses its superconductivity and is also roughened.

If another thin film is deposited on the contaminated surface of the above oxide superconductor thin film, it is difficult to deposit crystalline thin film on this contaminated surface. Therefore, a stacked structure in which thin films are successively deposited on the oxide superconductor thin film does not have desired properties so that it is difficult to use the stacked structure including the oxide superconductor thin film for superconducting device.

SUMMARY OF THE INVENTION

Accordingly, it is an object of the present invention to provide a method for manufacturing a superconducting thin film, which have overcome the above mentioned defects of the conventional ones.

Another object of the present invention is to provide a method for manufacturing a superconducting device, which have overcome the above mentioned defects of the conventional ones.

Still another object of the present invention is to provide a superconducting thin film, which have overcome the above mentioned defects of the conventional ones.

The above and other objects of the present invention are achieved in accordance with the present invention by a method for manufacturing a superconducting thin film having at least one non-superconducting region at and near its surface portion, the method comprising the step of forming on a surface of the substrate an oxide superconductor thin film, heating the oxide superconductor thin film in high vacuum environment so that oxygen of the oxide superconductor crystals escapes from the surface of the oxide superconductor thin film and a surface portion of the oxide superconductor thin film having a substantial thickness changes into non-superconducting layer of a compound oxide which is composed of the same constituent elements as those of said oxide superconductor but includes the oxygen amount less than that of said oxide superconductor and a thin superconducting channel is formed under the non-superconducting layer, selectively masking a portion of the non-superconducting layer which will become the non-superconducting region, and heating the non-superconducting layer in an oxidation atmosphere so that oxygen penetrates into the non-superconductor layer from exposed surface and the compound oxide of the exposed portion of the non-superconductor layer changes into the oxide superconductor which is electrically connected to the superconducting channel.

In a preferred embodiment, the oxide superconductor thin film is heated at a temperature ranging from 350° to 400° C. in order to change its surface portion into the non-superconducting layer. Oxygen of an oxide superconductor crystals immigrates best at temperatures ranging from 350° to 400° C. Therefore, it is preferable to heat the oxide superconductor thin film at a temperature ranging from 350° to 400° in order to shorten the process time. If the oxide superconductor thin film is heated at a temperature higher than 400° C., the oxide superconductor may be decomposed so that it does not show the superconductivity again when oxygen is supplied. In addition, if the heat treatment is carried out at a temperature ranging from 350° to 400° C., it is easy to control the thickness of the non-superconducting layer by the process time. The preferable pressure of the heat treatment is not higher than $1\times10^{-9}$ Torr.

It is also preferable that the non-superconducting layer is heated at a temperature ranging from 350° to 400° C. in order to change the portion of the non-superconducting layer into the oxide superconductor. In this case, the pressure of $O_2$ is preferably selected within a range of 0.1 to 100 mTorr.

On the other hand, if an oxide superconductor thin film is formed on the non-superconducting layer, the superconductivity is recovered. Namely, forming an oxide superconductor thin film on the nonsuperconducting layer has a same effect as that of the above mentioned heat treatment.

In a preferred embodiment, the oxide superconductor thin film is a c-axis orientated oxide superconductor thin film. Since the c-axis orientated thin film has a large critical current density in the direction in parallel to the substrate surface.

It is desired that the abovementioned oxide superconductor is a high-$T_c$ (high critical temperature) oxide superconductor. This high-$T_c$ oxide superconductor has been studied by many researchers since the discovery of Bednorz and Müller in 1986, and is said to indicate oxide superconductor having a critical temperature of not less than 30K. More specifically, the oxide superconductor is a high-$T_c$ copper-oxide type compound oxide superconductor including a Y—Ba—Cu—O type compound oxide superconductor, a Bi—Sr—Ca—Cu—O type compound oxide superconductor and a Tl—Ba—Ca—Cu—O type compound oxide superconductor.

In addition, the substrate, on which the oxide superconductor layer is deposited, can be formed of an insulating substrate, preferably an oxide single crystalline substrate such as MgO, $SrTiO_3$, $CdNdAlO_4$, etc. These substrate materials are very effective in forming or growing a crystalline film having a high quality superconductivity. However, the superconducting films can be formed on a semiconductor substrate if an appropriate buffer layer is deposited thereon. For example, the buffer layer on the semiconductor substrate can be formed of a double-layer coating formed of a $MgAlO_4$ layer and a $BaTiO_3$ layer if silicon is used as a substrate.

According to another aspect of the present invention, there is provided a method for manufacturing a superconducting device, the method comprising the step of forming on a surface of the substrate a first oxide superconductor thin film, heating the first oxide superconductor thin film in high vacuum environment so that oxygen of the oxide superconductor crystals escapes from the surface of the first oxide superconductor thin film and a surface portion of the first oxide superconductor thin film having a substantial thickness changes into non-superconducting layer of a compound oxide which is composed of the same constituent elements as those of said oxide superconductor but includes the oxygen amount less than that of said oxide superconductor and a thin superconducting channel is formed under the non-superconducting layer, forming a metal electrode on a portion of the non-superconducting layer, and forming a second oxide superconductor thin film of the said oxide superconductor on the exposed portion of the non-superconducting layer so that oxygen penetrates into the non-superconductor layer from exposed surface and the compound oxide of the exposed portion of the non-superconductor layer changes into a superconducting region of said oxide superconductor and the second oxide superconductor thin film is electrically connected to the superconducting channel with the recovered superconducting region.

According to a third aspect of the present invention, there is provided a method for manufacturing a superconducting device, the method comprising the step of forming on a surface of the substrate a c-axis orientated oxide superconductor thin film, heating the c-axis orientated oxide superconductor thin film in high vacuum environment so that oxygen of the oxide superconductor crystals escapes from the surface of the c-axis orientated oxide superconductor thin film and a surface portion of the first oxide superconductor thin film having a substantial thickness changes into non-superconducting layer of a compound oxide which is composed of the same constituent elements as those of said oxide superconductor but includes the oxygen amount less than that of said oxide superconductor and a thin superconducting channel is formed under the non-superconducting layer, forming a insulator layer and a metal layer stacked on the insulator layer, etching the metal layer and the insulator layer so that a gate electrode stacked on a gate insulator is formed on a center portion of the non-superconducting layer, forming insulator members at the both sides of the gate electrode, and forming an a-axis orientated oxide superconductor thin film on the exposed portion of the non-superconducting layer so that oxygen penetrates into the non-superconductor layer from exposed surfaces and the compound oxide of the exposed portion of the non-superconductor layer change into superconducting regions of said oxide superconductor while the a-axis orientated oxide superconductor thin film is deposited and a superconducting source region and a superconducting drain region which are isolated from the gate electrode and electrically connected to each other with the recovered superconducting regions and the superconducting channel are formed beneath the gate electrode.

According to still another aspect of the present invention, there is provided a superconducting thin film formed on a substrate, comprising at least one superconducting region of an oxide superconductor, at least one insulating region of a compound oxide which is composed of the same constituent elements as those of said oxide superconductor but includes the oxygen amount less than that of said oxide superconductor at and near a surface portion having a substantial thickness and a superconducting channel of said oxide superconductor under the non-superconducting surface portion.

In a preferred embodiment, the superconducting region forms a superconducting path or a superconducting circuit.

According to another aspect of the present invention, there is provided a superconducting device comprising a substrate, an extremely thin superconducting channel formed of an oxide superconductor thin film on the principal surface of the substrate, three superconducting regions of a relatively thick thickness formed of the oxide superconductor on the superconducting channel separated from each other but electrically connected through the superconducting channel, so that a superconducting current can flow through the superconducting channel between a pair of the superconducting regions, and two gate electrodes through gate insulators formed of the same constituent atoms of the superconductor and arranged on the superconducting channel for controlling the superconducting current flowing through the superconducting channel.

According to another aspect of the present invention, there is provided a superconducting device comprising a substrate, an extremely thin superconducting channel formed of an oxide superconductor thin film on the principal surface of the substrate, a superconducting source region and a superconducting drain region of a relatively thick thickness formed of the oxide superconductor on the superconducting channel separated from each other but electrically connected through the superconducting channel, so that a superconducting current can flow through the superconducting channel between the superconducting source region and the superconducting drain region, a gate electrode through a gate insulator formed of the same constituent atoms of the superconductor and arranged on the superconducting channel for controlling the superconducting current flowing through the superconducting channel, and a insulating region which surrounds the gate electrode so that the gate electrode is electrically isolated from the superconducting channel, the superconducting source region and the superconducting drain region.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1E, a first embodiment of the process in accordance with the present invention for manufacturing the superconducting thin film will be described.

Figure 1A:
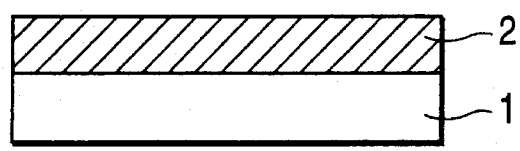
FIGS. 1A to 1E are diagrammatic sectional views for illustrating a first embodiment of the process in accordance with the present invention for manufacturing the superconducting thin film.

As shown in FIG. 1A, there is prepared a substrate 1 having an $Y_1Ba_2Cu_3O_{7-\delta}$ oxide superconductor thin film 2 formed on its principal surface thereof. A c-axis orientated thin film is preferably deposited, since the c-axis orientated thin film has a large critical current density in the direction in parallel to the substrate surface.

The $Y_1Ba_2Cu_3O_{7-\delta}$ oxide superconductor thin film 2 having a thickness of for example 400 nanometers is deposited on the principal surface of the substrate 1 by for example an off-axis sputtering, a reactive evaporation, an MBE (molecular beam epitaxy), a CVD, etc. The condition of forming the c-axis orientated $Y_1Ba_2Cu_3O_{7-\delta}$ oxide superconductor thin film 2 by off-axis sputtering was as follows:

| | |
|---|---|
| Sputtering Gas | Ar: 90% |
| | $O_2$: 10% |
| Total pressure | $5 \times 10^{-2}$ Torr |
| Temperature of the substrate | 700° C. |

Then the $Y_1Ba_2Cu_3O_{7-\delta}$ oxide superconductor thin film 2 is heated at a temperature of 375° C. in high vacuum environment under the background pressure of less than $1 \times 10^{-9}$ Torr. The condition of the heat-treatment was as follows:

| | |
|---|---|
| Pressure | $<1 \times 10^{-9}$ Torr |
| Temperature of the substrate | 375° C. |
| Heating duration | 10 minutes |

Figure 1B:
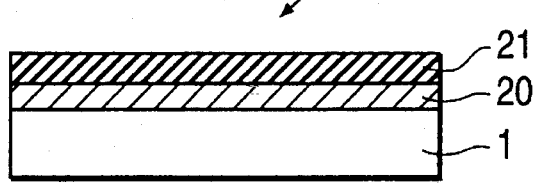

After the heat-treatment, the surface portion having a thickness of 15 nanometers of the $Y_1Ba_2Cu_3O_{7-\delta}$ oxide superconductor thin film 2 is changed into a non-superconducting layer 21 formed of $Y_1Ba_2Cu_3O_{7-\epsilon}$ ($\delta<\epsilon<7$) non-superconducting oxide, as shown in FIG. 1B. Lower portion of the $Y_1Ba_2Cu_3O_{7-\delta}$ oxide superconductor thin film 2 becomes a superconducting channel 20.

Figure 1C:
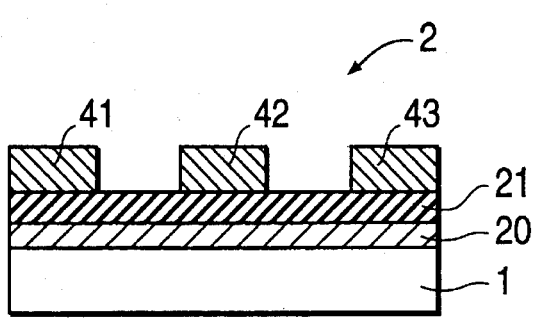

Thereafter, as shown in FIG. 1C, photoresist layers 41, 42 and 43 are formed on the $Y_1Ba_2Cu_3O_{7-\delta}$ oxide superconductor thin film 2, namely on the non-superconducting layer 21, separately from each other. Then the $Y_1Ba_2Cu_3O_{7-\delta}$ oxide superconductor thin film 2 is heated at a temperature of 375° C. in an oxygen atmosphere. The condition of the heat-treatment was as follows:

| | |
|---|---|
| Pressure of $O_2$ | $1 \times 10^{-2}$ Torr |
| Temperature of the substrate | 375° C. |
| Heating duration | 10 minutes |

Figure 1D:
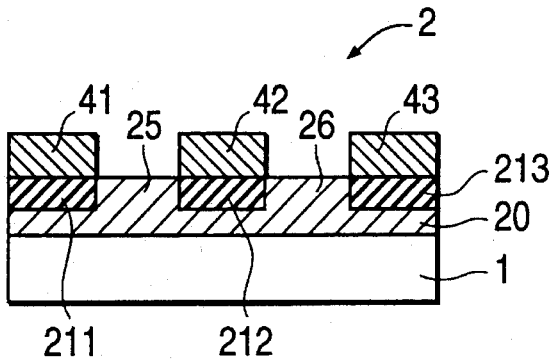

During the heat treatment, oxygen penetrates into the exposed surface portions 25 and 26 of the non-superconducting layer 21 so that the $Y_1Ba_2Cu_3O_{7-\epsilon}$ non-superconducting oxide of the portions changes into the $Y_1Ba_2Cu_3O_{7-\delta}$ oxide superconductor. After the heat treatment, the portions 211, 212 and 213 under the photoresist layers 41, 42 and 43 remain non-superconducting, and the surface superconducting portions 25 and 26 connect to the superconducting channel 20, as shown in FIG. 1D. The recovered superconducting portions 25 and 26 are patterned into arbitrary shapes by forming the photoresist layers 41, 42 and 43 into the reciprocal shapes so that the $Y_1Ba_2Cu_3O_{7-\delta}$ oxide superconductor thin film 2 has a superconducting contact region at the surface.

Figure 1E:
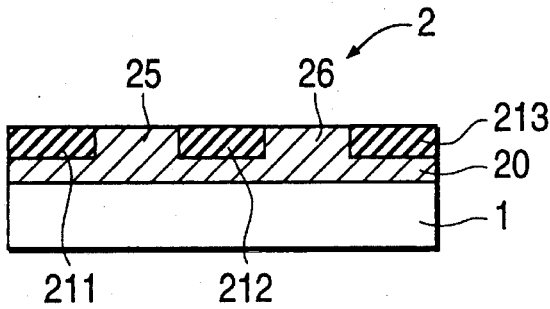

Finally, as shown in FIG. 1E, the photoresist layers 41, 42 and 43 are removed, if necessary, and the superconducting thin film is completed. In this connection, it is preferable that the method for removing the photoresist layers 41, 42 and 43 does not affect the $Y_1Ba_2Cu_3O_{7-\delta}$ oxide superconductor, for example a dry etching process.

The surface superconducting portions 25 and 26 of the $Y_1Ba_2Cu_3O_{7-\delta}$ oxide superconductor thin film 2 manufactured in accordance with the present invention is not degraded, since no photoresist layer is formed on the portions. Therefore, both the superconducting channel 20 and the surface superconducting portions 25 and 26 of the $Y_1Ba_2Cu_3O_{7-\delta}$ oxide superconductor thin film 2 have high quality superconductivity.

As explained above, if the superconducting thin film is manufactured in accordance with the above mentioned process, a superconducting pattern can be formed without spoiling the superconductivity of the oxide superconductor. Accordingly, it is easy to manufacture the superconducting pattern with good repeatability, and the manufactured superconducting pattern has stable characteristics.

Embodiment 2

Referring to FIGS. 2A to 2E, a second embodiment of the process in accordance with the present invention for manufacturing the superconducting device will be described.

Figure 2A:
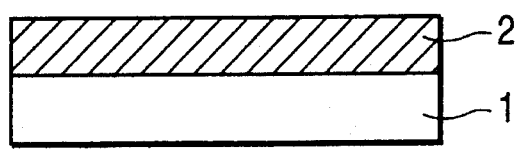
FIGS. 2A to 2E are diagrammatic sectional views for illustrating a second embodiment of the process in accordance with the present invention for manufacturing the superconducting device.

As shown in FIG. 2A, there is prepared a substrate 1 having an $Y_1Ba_2Cu_3O_{7-\delta}$ oxide superconductor thin film 2, similar to the substrate 1 and the $Y_1Ba_2Cu_3O_{7-\delta}$ oxide superconductor thin film 2 of the Embodiment 1. The $Y_1Ba_2Cu_3O_{7-\delta}$ oxide superconductor thin film 2 having a thickness of for example 20 nanometers is deposited on the principal surface of the substrate 1 by for example an off-axis sputtering. The off-axis sputtering is performed under the same condition as that of the Embodiment 1.

Then the $Y_1Ba_2Cu_3O_{7-\delta}$ oxide superconductor thin film 2 is heated at a temperature of 375° C. under high vacuum of less than $1\times10^{-9}$ Torr. The condition of the heat-treatment is same as that of the Embodiment 1.

Figure 2B:
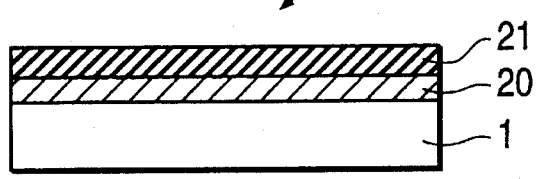

After the heat-treatment, the surface portion having a thickness of 15 nanometers of the $Y_1Ba_2Cu_3O_{7-\delta}$ oxide superconductor thin film 2 is changed into a non-superconducting layer 21 formed of $Y_1Ba_2Cu_3O_{7-\epsilon}$ ($\delta<\epsilon<7$) non-superconducting oxide, as shown in FIG. 2B. Lower portion of the $Y_1Ba_2Cu_3O_{7-\delta}$ oxide superconductor thin film 2 becomes a superconducting channel 20.

Figure 2C:
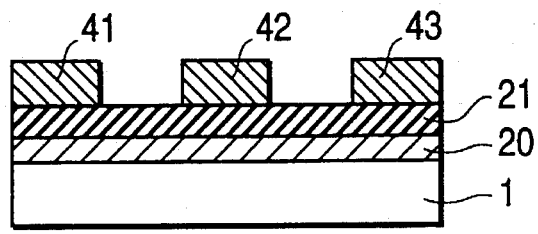

Thereafter, as shown in FIG. 2C, photoresist layers 41, 42 and 43 are formed on the $Y_1Ba_2Cu_3O_{7-\delta}$ oxide superconductor thin film 2, namely on the non-superconducting layer 21, separately from each other.

Figure 2D:
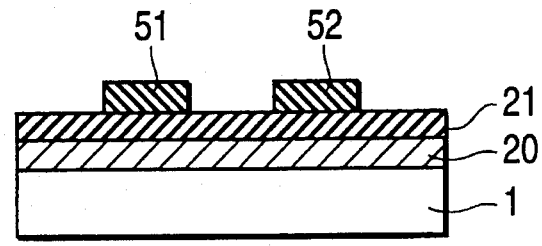

Then, Au layer is deposited on the $Y_1Ba_2Cu_3O_{7-\delta}$ oxide superconductor thin film 2 by a vacuum evaporation method. After then, the photoresist layers 41, 42 and 43 are removed so that gate electrodes 51 and 52 are formed on the non-superconducting layer 21, as shown in FIG. 2D. The non-superconducting layer 21 is little degraded by a photoresist developer and photoresist remover during the process.

Figure 2E:
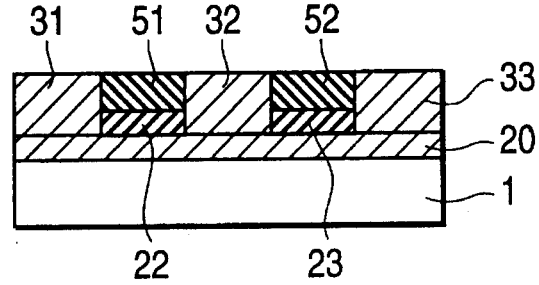

Finally, a $Y_1Ba_2Cu_3O_{7-\delta}$ oxide superconductor thin film is deposited on the non-superconducting layer 21 by an off-axis sputtering so that superconducting regions 31, 32 and 33 are formed, as shown in FIG. 2E. This $Y_1Ba_2Cu_3O_{7-\delta}$ oxide superconductor thin film is preferably a-axis orientated. While the $Y_1Ba_2Cu_3O_{7-\delta}$ oxide superconductor thin film is deposited, oxygen penetrates into portions of the non-superconducting layer 21 excluding portions under the gate electrode 51 and 52. The $Y_1Ba_2Cu_3O_{7-\epsilon}$ portions 31, 32 and 33 of the non-superconducting layer 21, into which oxygen penetrates, changes into the $Y_1Ba_2Cu_3O_{7-\delta}$ oxide superconductor so that gate insulators are formed only under the gate electrodes 51 and 52 and the superconducting regions 31, 32 and 33 are electrically connected to the superconducting channel 20.

Then, $Y_1Ba_2Cu_3O_{7-\delta}$ oxide superconductor thin films deposited on the gate electrodes 51 and 52 are removed so that the superconducting device has a planar surface, if necessary.

In the superconducting device manufactured by the above mentioned process, the superconducting current flowing through the superconducting channel 20 between the superconducting region 31 and 32 is controlled by a voltage applied to the gate electrode 51, and the superconducting current flowing through the superconducting channel 20 between the superconducting region 32 and 33 is controlled by a voltage applied to the gate electrode 52. Therefore, the superconducting device constitutes a kind of super-FET.

As explained above, if the above mentioned super-FET is manufactured in accordance with the above mentioned process, it becomes easy to form the stacked structure in which the gate insulator is stacked on the superconducting channel formed of an oxide superconductor thin film. In addition, since the upper surface of the superconductor thin film is planarized, it become easy to form conductor wirings in a later process. Accordingly, it is easy to manufacture the super-FET with good repeatability, and the manufactured super-FET has a stable performance.

Embodiment 3

Referring to FIGS. 3A to 3H, a third embodiment of the process in accordance with the present invention for manufacturing the super-FET will be described.

Figure 3A:
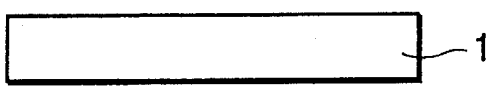
FIGS. 3A to 3H are diagrammatic sectional views for illustrating a third embodiment of the process in accordance with the present invention for manufacturing the super-FET.

As shown in FIG. 3A, there is prepared a substrate 1, similar to the substrate 1 of the Embodiment 1.

Figure 3B:
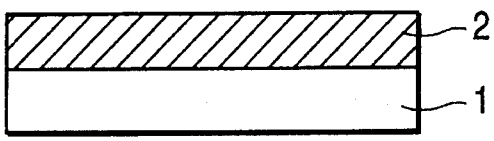

As shown in FIG. 3B, a c-axis orientated $Y_1Ba_2Cu_3O_{7-\delta}$ oxide superconductor thin film 2 having a thickness of for example 20 nanometers is deposited on the principal surface of the substrate 1 by for example an off-axis sputtering. The off-axis sputtering is performed under the same condition as that of the Embodiment 1.

Then the $Y_1Ba_2Cu_3O_{7-\delta}$ oxide superconductor thin film 2 is heated at a temperature of 375° C. under high vacuum of less than $1\times10^{-9}$ Torr. The condition of the heat-treatment is same as that of the Embodiment 1.

Figure 3C:
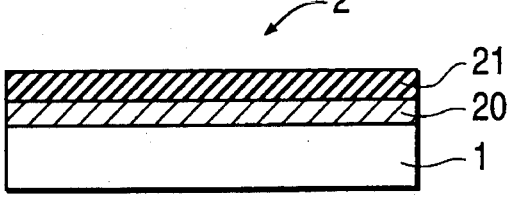

After the heat-treatment, the surface portion having a thickness of 15 nanometers of the $Y_1Ba_2Cu_3O_{7-\delta}$ oxide superconductor thin film 2 is changed into a non-superconducting layer 21 formed of $Y_1Ba_2Cu_3O_{7-\epsilon}$ ($\delta<\epsilon<7$) non-superconducting oxide, as shown in FIG. 3C. Lower portion of the $Y_1Ba_2Cu_3O_{7-\delta}$ oxide superconductor thin film 2 becomes a superconducting channel 20.

Figure 3D:
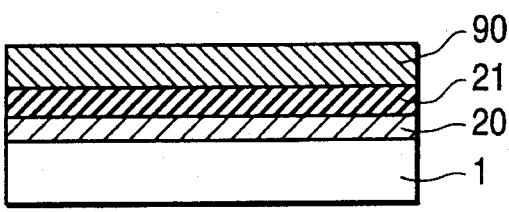

Thereafter, as shown in FIG. 3D, a $Si_3N_4$ thin film 90 is deposited on the $Y_1Ba_2Cu_3O_{7-\delta}$ oxide superconductor thin film 2, namely on the non-superconducting layer 21. While the $Si_3N_4$ thin film 90 is deposited, Si diffuses into the non-superconducting layer 21. However, the quantity of the diffusing Si is slight so that the diffusing Si does not affect the non-superconducting layer 21. Instead of $Si_3N_4$, $SiO_2$ can also be used.

Figure 3E:
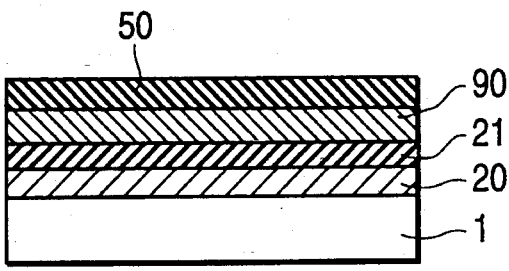
Figure 3F:
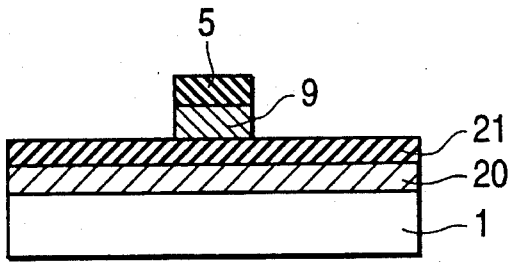

Then, an Au film 50 is deposited on the $Si_3N_4$ thin film 90 by a vacuum evaporation method, as shown in FIG. 3E. The Au film 50 and the $Si_3N_4$ thin film 90 are selectively etched so as remove all of the Au film 50 and the $Si_3N_4$ thin film 90 excluding a portion which becomes a gate electrode 5 and a gate insulator by an unisotropic etching process, for example a reactive ion etching process or an ion milling using Ar-ions, as shown in FIG. 3F.

Figure 3G:
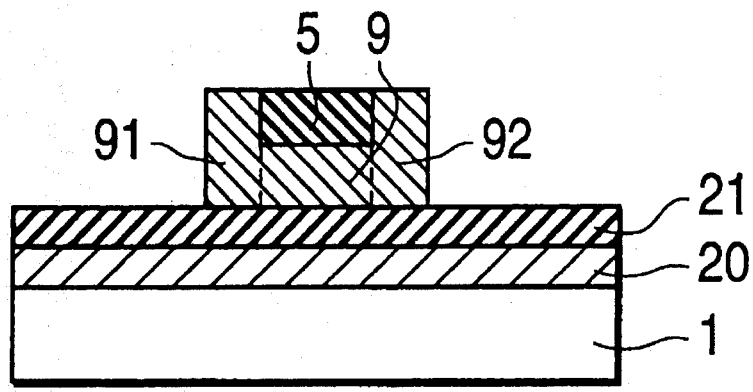
Figure 3H:
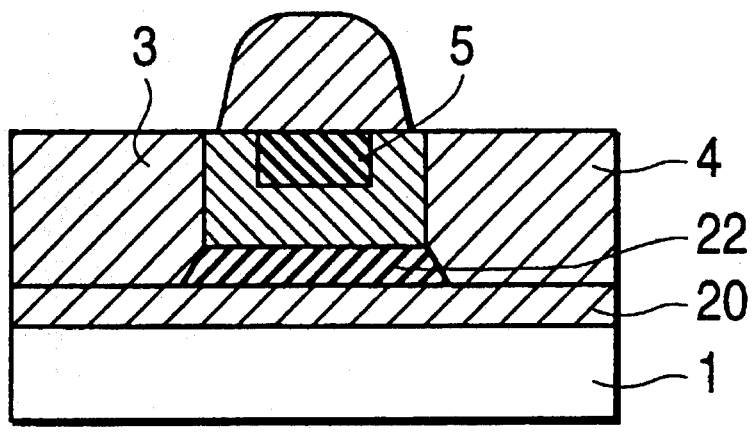

After then, side insulating members 91 and 92 of $Si_3N_4$ are formed at the both sides of the gate electrode 5, as shown in FIG. 3G. Finally, an a-axis orientated $Y_1Ba_2Cu_3O_{7-\delta}$ oxide superconductor thin film having a thickness of 800 nanometers is deposited on the non-superconducting layer 21 by an off-axis sputtering so that a superconducting source region 3 and a superconducting drain region 4 are formed, as shown in FIG. 3H.

The condition of forming the a-axis orientated $Y_1Ba_2Cu_3O_{7-\delta}$ oxide superconductor thin film by off-axis sputtering was as follows:

| | |
|---|---|
| Sputtering Gas | Ar: 90% |
| | $O_2$: 10% |
| Total pressure | $5 \times 10^{-2}$ Torr |
| Temperature of the substrate | 630° C. |

While the a-axis orientated $Y_1Ba_2Cu_3O_{7-\delta}$ oxide superconductor thin film is deposited, oxygen penetrates into portions of the non-superconducting layer 21 excluding portions under the gate electrode 5. The c-axis orientated $Y_1Ba_2Cu_3O_{7-\epsilon}$ portions of the non-superconducting layer 21, into which oxygen penetrates, changes into the $Y_1Ba_2Cu_3O_{7-\delta}$ oxide superconductor so that gate insulators are formed only under the gate electrode 5 and the superconducting source region 3 and superconducting drain region 4 are electrically connected to the superconducting channel 20.

Then, the a-axis orientated $Y_1Ba_2Cu_3O_{7-\delta}$ oxide superconductor thin films deposited on the gate electrode 5 is removed so that the superconducting device has a planar surface, if necessary.

As explained above, if the above mentioned super-FET is manufactured in accordance with the above mentioned process, it becomes easy to form the stacked structure in which the gate insulator is stacked on the superconducting channel formed of an oxide superconductor thin film. In addition, since the upper surface of the superconductor thin film is planarized, it become easy to form conductor wirings in a later process. Accordingly, it is easy to manufacture the super-FET with good repeatability, and the manufactured super-FET has a stable performance.

In the above mentioned embodiments, the oxide superconductor thin film can be formed of not only the Y—Ba—Cu—O type compound oxide superconductor material, but also a high-$T_c$ (high critical temperature) oxide superconductor material, particularly a high-$T_c$ copper-oxide type compound oxide superconductor material, for example a Bi—Sr—Ca—Cu—O type compound oxide superconductor material, and a Tl—Ba—Ca—Cu—O type compound oxide superconductor material.

The invention has thus been shown and described with reference to the specific embodiment. However, it should be noted that the present invention is in no way limited to the details of the illustrated structures but converts and modifications may be made within the scope of the appended claims.

We claim:

1. A method for manufacturing a superconducting thin film having at least one non-superconducting region at and near its surface portion, the method comprising the steps of:

forming on a surface of a substrate a thin film of an oxide superconductor that comprises oxide superconductor crystals, heating the oxide superconductor thin film in high vacuum environment so that oxygen of the oxide superconductor crystals of the oxide superconductor thin film escapes from the surface of the oxide superconductor thin film and a surface portion of the oxide superconductor thin film having a substantial thickness changes into a non-superconducting layer of a compound oxide which is composed of the same constituent elements as the oxide superconductor but which includes an amount of oxygen less than that of the oxide superconductor, thereby forming a thin superconducting channel under the non-superconducting layer, selectively masking a portion of the non-superconducting layer which will become a non-superconducting region, and heating the masked non-superconducting layer in an oxidation atmosphere so that oxygen penetrates into an exposed portion of the non-superconductor layer and the compound oxide of the exposed portion of the non-superconductor layer changes into oxide superconductor which is electrically connected to the superconducting channel.

2. A method claimed in claim 1 wherein the oxide superconductor thin film is heated at a temperature ranging from 350° to 400° C. in order to change its surface portion into the non-superconducting layer.

3. A method claimed in claim 1 wherein the oxide superconductor thin film is heated under a pressure of less than $1\times10^{-9}$ Torr in order to change its surface portion into the non-superconducting layer.

4. A method claimed in claim 1 wherein the non-superconducting layer is heated at a temperature ranging from 350° to 400° C. in order to change the portion of the non-superconducting layer into the oxide superconductor.

5. A method claimed in claim 1 wherein the non-superconducting layer is heated in an oxidation atmosphere of which partial pressure of $O_2$ is selected within a range of 0.1 to 100 mTorr.

6. A method claimed in claim 1 wherein the oxide superconductor thin film is a c-axis orientated oxide superconductor thin film.

7. A method claimed in claim 1 wherein the oxide superconductor is formed of high-$T_c$ (high critical temperature) oxide superconductor.

8. A method claimed in claim 1 wherein the oxide superconductor is formed of oxide superconductor material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

9. A method claimed in claim 1 wherein the substrate is formed of a material selected from the group consisting of a MgO (100) substrate, a $SrTiO_3$ (100) substrate, a CdNdAlO$_4$ (001) substrate and a semiconductor substrate.

10. A method claimed in claim 9 wherein the substrate is formed of a silicon substrate and a principal surface of the silicon substrate is coated with an insulating material layer which is formed of a $MgAlO_4$ layer and a $BaTiO_3$ layer.

11. A method for manufacturing a superconducting device, the method comprising the steps of:

forming on a surface of a substrate a first thin film of an oxide superconductor that comprises oxide superconductor crystals, heating the first oxide superconductor thin film in high vacuum environment so that oxygen of the oxide superconductor crystals of the oxide superconductor thin film escapes from the surface of the oxide superconductor thin film and a surface portion of the oxide superconductor thin film having a substantial thickness changes into a non-superconducting layer of a compound oxide which is composed of the same constituent elements as the oxide superconductor but which includes an amount of oxygen less than that of the oxide superconductor, thereby forming a thin superconducting channel under the non-superconducting layer, forming a metal electrode on a portion of the non-superconducting layer, and forming a second thin film of the oxide superconductor on an exposed portion of the non-superconducting layer so that oxygen penetrates into the exposed portion of the non-superconductor layer and the compound oxide of the exposed portion of the non-superconductor layer changes into a superconducting region of the oxide superconductor and the second oxide superconductor thin film is electrically connected to the superconducting channel through the superconducting region.

12. A method claimed in claim 11 wherein the first oxide superconductor thin film is a c-axis orientated oxide superconductor thin film and the second oxide superconductor thin film is an a-axis orientated oxide superconductor thin film.

13. A method for manufacturing a superconducting device, the method comprising the step of forming on a surface of the substrate a c-axis orientated oxide superconductor thin film, heating the c-axis orientated oxide superconductor thin film in high vacuum environment so that oxygen of the oxide superconductor crystals escapes from the surface of the c-axis orientated oxide superconductor thin film and a surface portion of the first oxide superconductor thin film having a substantial thickness changes into non-superconducting layer of a compound oxide which is composed of the same constituent elements as those of said oxide superconductor but includes the oxygen amount less than that of said oxide superconductor and a thin superconducting channel is formed under the non-superconducting layer, forming a insulator layer and a metal layer stacked on the insulator layer, etching the metal layer and the insulator layer so that a gate electrode stacked on a gate insulator is formed on a center portion of the non-superconducting layer, forming insulator members at the both sides of the gate electrode, and forming an a-axis orientated oxide superconductor thin film on the exposed portion of the non-superconducting layer so that oxygen penetrates into the non-superconductor layer from exposed surfaces and the compound oxide of the exposed portion of the non-superconductor layer change into superconducting regions of said oxide superconductor while the a-axis orientated oxide superconductor thin film is deposited and a superconducting source region and a superconducting drain region which are isolated from the gate electrode and electrically connected to each other with the recovered superconducting regions and the superconducting channel are formed beneath the gate electrode.

14. A method as claimed in claim 1, wherein the oxide superconductor thin film is a c-axis oriented oxide superconductor thin film.

15. A method as claimed in claim 1, wherein the oxide superconductor thin film is a Y—Ba—Cu—O—type compound oxide superconductor.

16. A method as claimed in claim 1, wherein the oxide superconductor thin film is a Bi—Sr—Ca—Cu—O—type compound oxide superconductor.

17. A method as claimed in claim 1, wherein the oxide superconductor thin film is a Tl—Ba—Ca—Cu—O—type compound oxide superconductor.

18. A method as claimed in claim 1, wherein the substrate is a single crystalline MgO substrate.

19. A method as claimed in claim 1, wherein the substrate is a single crystalline $SrTiO_3$ substrate.

20. A method as claimed in claim 1, wherein the substrate is a single crystalline $CdNdAlO_4$ substrate.

21. A method claimed in claim 7, wherein the high-$T_c$ oxide superconductor is a high-$T_c$ copper-oxide type compound oxide superconductor.

22. A method as claimed in claim 11, wherein the oxide superconductor thin film is a c-axis oriented oxide superconductor thin film.

* * * * *